United States Patent [19]

Derby et al.

[11] Patent Number: 5,379,767
[45] Date of Patent: Jan. 10, 1995

[54] MRI RF COIL USING ZERO-PITCH SOLENOIDAL WINDING

[75] Inventors: Kevin A. Derby, San Bruno; Leon Kaufman, San Francisco, both of Calif.

[73] Assignee: The Regents of the University of California, Oakland, Calif.

[21] Appl. No.: 939,736

[22] Filed: Sep. 2, 1992

[51] Int. Cl.⁶ .............................................. A61B 5/055
[52] U.S. Cl. ............................ 128/653.5; 128/653.1; 334/318; 334/322; 600/15
[58] Field of Search .................... 128/653.5, 653.1; 324/318, 322; 343/718, 867, 744, 742; 600/13-15

[56] References Cited

U.S. PATENT DOCUMENTS

| | | | |
|---|---|---|---|
| 4,581,580 | 4/1986 | Keim | 324/318 |
| 4,616,181 | 10/1986 | Kemner et al. | 324/309 |
| 4,634,980 | 1/1987 | Misic et al. | 324/318 |
| 4,636,728 | 1/1987 | Compton et al. | 324/309 |
| 4,695,801 | 9/1987 | Arakawa et al. | 324/318 |
| 4,737,716 | 4/1988 | Roemer et al. | 324/318 |
| 4,752,738 | 6/1988 | Patrick et al. | 324/318 |
| 4,757,804 | 7/1988 | Griffith et al. | 600/13 |
| 4,774,468 | 9/1988 | Bydder | 324/318 |
| 4,783,641 | 11/1988 | Hayes et al. | 333/219 |
| 4,875,013 | 10/1989 | Murakami et al. | 324/318 |
| 4,887,038 | 12/1989 | Votruba et al. | 324/318 |
| 4,949,044 | 8/1990 | Starewicz | 324/320 |
| 4,956,609 | 9/1990 | Miyajima | 324/322 |
| 5,023,555 | 6/1991 | Ehnholm | 324/318 |
| 5,084,676 | 1/1992 | Saho et al. | 324/318 |
| 5,107,216 | 4/1992 | Yabusaki et al. | 324/318 |
| 5,116,304 | 5/1992 | Cadwell | 600/15 |
| 5,197,940 | 3/1993 | Sievert et al. | 600/13 |

OTHER PUBLICATIONS

Hitachi–The Advantages of 0.2 Tesla Vertical–Field Permanent Magnet Technology–Hitachi Medical Systems American, Inc.–11 pages.

*Primary Examiner*—Lee S. Cohen
*Assistant Examiner*—Brian L. Casler
*Attorney, Agent, or Firm*—Nixon & Vanderhye

[57] ABSTRACT

A quadrature detection (QD) head coil assembly for use in magnetic resonance imaging (MRI) having a pair of orthogonally situated zero-pitch solenoidal windings is disclosed. The turns of each winding are serially connected along the solenoid surface in a predetermined axially-extending area by using dog leg connectors. Return coil connections (i.e., an RF connection between the first and last turn of each coil) is effected substantially adjacent to the dog leg interconnections so as to minimize the area of any equivalent return loop and thus to minimize the magnitude of any inter-coil coupling via such return loops. To further minimize possible inter-coil coupling, the return loops for each of the quadrature detection coils are preferably oriented so as to primarily couple to magnetic fields that are orthogonal to the main field of both the QD coils. The use of zero- pitch turfs in each solenoidal coil winding also substantially reduces possible inter-coil coupling.

33 Claims, 7 Drawing Sheets

MRI RF COIL USING ZERO-PITCH SOLENOIDAL WINDING

BACKGROUND OF THE INVENTION

This invention relates generally to the field of magnetic resonance imaging (MRI) which utilizes and is based upon the phenomenon of nuclear magnetic resonance (NMR) to generate visual depictions of spatial distributions of NMR nuclei interior to a structure such as the living human body. This invention is particularly useful in making quadrature detection (QD) coil assemblies for use in MRI of the human head—especially when using lower strength polarizing magnetic fields (and thus correspondingly lower NMR RF frequencies).

Magnetic resonance imaging is by now well-known and in widespread commercial use. In general, a strong, nominally static, nominally uniform, polarizing magnetic field tends to align significant proportions of the body nuclei which have a net magnetic moment. By suitably nutating these populations of nuclei using NMR phenomena (e.g., with a succession of RF nutation pulses and coordinated magnetic gradient pulses), NMR RF signals are elicited from these nuclei. Such NMR RF signals include spatially encoded information that can later be processed to produce a visual map of the NMR nuclei density along desired surfaces passing through the human body.

One of the factors critical to successful MRI is efficient RF coupling to the weak NMR RF signal responses. One known technique for enhancing the signal-to-noise ratio, of such detected NMR RF signals involves the use of so-called quadrature detection RF receiving coils. In general, the magnetic field associated with NMR RF responses is orthogonal to the static polarizing magnetic field. By arranging to have two independent RF reception coils also disposed orthogonally to one another, one can subsequently combine these two independent channels of signal reception so as to provide an increased signal-to noise-ratio in the net received signal.

For higher strength polarizing fields (and thus correspondingly higher NMR RF frequencies) there are various QD coil assemblies already known in the prior art. For lower strength magnetic fields (and/or for polarizing fields that are disposed vertically rather than horizontally), solenoidal RF receiving coils are sometimes more appropriately utilized. However, it has heretofore been quite difficult to find a solenoidal RF coil structure that can be conveniently used for quadrature detection while at the same time permitting convenient ingress and egress of relevant human body portions (e.g., the head) into the multi-coil structure.

RF coils used in MRI typically utilize a combination of inductance and capacitance to resonate at the NMR frequency of the nuclear species to be imaged. For the most prevalent proton imaging, this frequency is typically in the range of 2 to 70 megahertz, depending upon the strength of the static polarizing magnetic field. Above about 10 megahertz, there are several known designs that may be used for MRI RF coils. However, at lower frequencies, most of these designs become impractical. One reason for such impracticality is that the resonant frequency of a coil changes inversely with respect to the square root of the product of its inductance and capacitance. Therefore, as the resonant frequency is lowered, the product of inductance and capacitance must increase as the inverse square of the frequency. Most previous MRI RF coil designs do not have sufficient inductance to make efficient coils below about 5 megahertz.

The most efficient coil design for low field MRI is probably the simplest, namely, the solenoid. The solenoid has several advantages, most notably, its relatively high inductance and good field uniformity. However, adapting the solenoid to quadrature detection for MRI is quite difficult.

For example, to realize a quadrature detection MRI RF coil, one needs two separate resonant coils, each of which produces a magnetic field disposed perpendicularly with respect to the static polarizing magnetic field. In addition, the fields of the two resonant coils must be perpendicular to each other—i.e., the coils should not be inter-coupled since this will make tuning difficult and/or result in degradation of signal-to noise-ratio. As those skilled in the art will appreciate, decoupling two high Q (i.e., quality factor) resonators which are in close proximity can be an extremely difficult problem.

Figure 1:
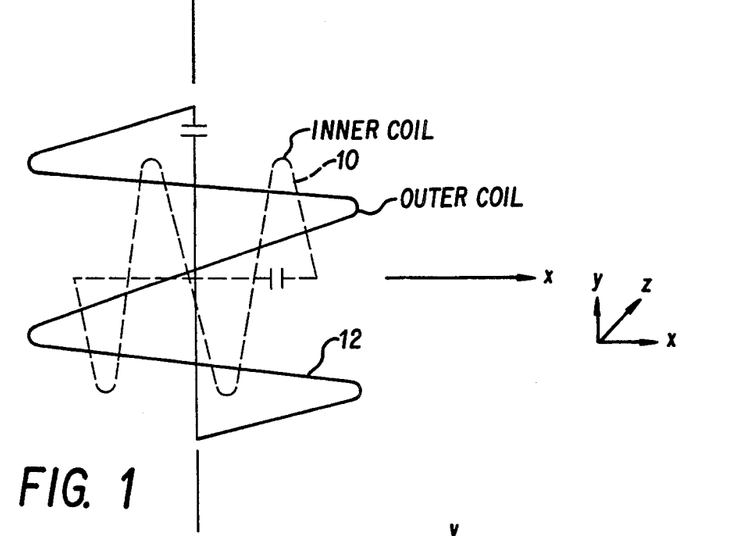
FIG. 1 is a schematic depiction of two pitched-winding solenoidal coils having perpendicular longitudinal axes.

Consider, for example, the coil assembly of FIG. 1. Here, the assembly includes two separate solenoidal resonators; an inner-coil 10 ( shown in dotted lines) contained inside an outer coil 12 (shown in solid lines). As drawn in FIG. 1, the longitudinal axis of the inner-coil coincides with the x-coordinate axis while the longitudinal axis of the outer coil coincides with the y-coordinate axis. The ends of the first and last turns of these coils are connected with a return loop RF connection including a resonating capacitor. Since the solenoidal coils 10, 12 have their longitudinal axes mutually perpendicular, it might appear at first glance that such an arrangement would satisfy the requirements for a possible quadrature detection (QD) MRI RF coil arrangement (forgetting for a moment about the problem of ingress and egress of human anatomy). However, an experiment with a pair of such solenoidal RF coils as depicted in FIG. 1 will show a relatively strong inter-coil coupling. Of course, this is contrary to desired QD MRI RF coil design criteria.

Detailed study of the inter-coil coupling that is experienced with an arrangement such as that shown in FIG. 1 has revealed that such coupling is related, among other things, to the fact that each turn of the solenoids 10 and 12 is pitched at an angle with respect to its longitudinal axis. The inter-coil coupling of the assembly shown in FIG. 1 also is affected by positioning of the current return path (i.e., the conductor and serial resonating capacitor connecting the ends of the solenoid). While it is true that the magnetic field associated with inner-coil 10 is primarily along the x-axis, because the turns are pitched ( and because of the positioning of the current return path—i.e., contained in the x-z plane, the z-axis protruding from the plane of FIG. 1, there will be an additional equivalent current loop in the x-z plane which produces a field oriented in the y-axis direction. Therefore, such an equivalent current loop will couple directly to the main field of the second coil, producing disadvantageous inter-coil coupling. Similarly, as depicted in FIG. 1, the outer coil 12 will produce some field along the x-axis direction which couples directly to the main field of the inner-coil 10, thus further compounding the inter-coil coupling problem.

Of course, decoupling may still be achieved between the inner-coil 10 and the outer coil 12 in FIG. 1 by adjusting the orientation, i.e., angle, between the longitudinal axes of the two coils. At some angle other that 90°, the net fields produced by the two coils will be orthogonal and the coils will be decoupled from one another. Unfortunately, such decoupling by angular repositioning will be extremely sensitive to the angle adjustment and to other minor variations in coil construction.

SUMMARY OF THE INVENTION

We have now discovered a novel MRI RF coil construction utilizing zero-pitch turns that is particularly useful fin overcoming such problems. The resulting MRI RF coil assembly and its method of construction is believed to represent a significant advance in the art of magnetic resonance imaging. It is particularly applicable to the realization of quadrature detection (QD) MRI RF coils for use at low (e.g., less than 5 megahertz) frequencies. Our novel construction method greatly attenuates inter-coil coupling, simplifies coil construction techniques and increases reliable and efficient MRI RF operation.

Although there are many novel features included in our invention, there are two generally strategic features that are considered especially important to its success. A first feature involves minimizing the spurious magnetic field associated with a solenoidal coil (i.e., the field that is not directed along the longitudinal axis of the solenoidal coil). To achieve this end, we first wind the solenoid in a novel manner. For example, instead of using pitched windings, we use zero-pitch windings, which are serially interconnected with small, localized, "dog legs." In this manner, all of the "on-axis" displacement associated with the serially inter-connected conductor windings takes place only in a relatively small predetermined axially extending location. In conjunction with these "dog leg" interconnections between the turns, the return current loop or path is passed directly back over such dog leg connections, with only a very small gap between the dog legs and the return path. These features tend to reduce the area of the return current loop while also controllably localizing the conductors which give rise to such an effective extra current loop, and these factors (even if taken alone) tend to reduce the unwanted magnetic field coupling by a large factor.

In addition, in the preferred embodiment, since the equivalent return current loop factors have now been localized and identified (rather than distributed throughout the usual pitched turn solenoidal coil), the equivalent current loop can be strategically oriented so as to further minimize unwanted inter-coil coupling. For example, in the example of FIG. 1, the field from the unwanted current loops are located in the worst possible direction: the return conductor and resonating capacitor constitutes a return path which directly couples to the main field of the other coil. By moving the now localized equivalent current loop, it can be caused to effectively couple primarily only to magnetic fields that are transverse to both of the inner and outer coils 10 and 12. For example, by moving the position of the return paths in conjunction with zero-pitch turns in both solenoids, the unwanted equivalent current loop can be caused to primarily couple to fields oriented in the z-axis direction (i.e., by locating both the equivalent return loops within the x-y plane so that residual fields from remaining unwanted current loops point along the z-axis and do not directly couple to the main fields of either coil).

By using a combination of these two strategies (as in the presently preferred exemplary embodiment), one may effectively eliminate stray fields due to current return paths thus enabling the longitudinal axes of the solenoidal coils per se to be oriented at 90° with respect to one another. Such a combination of strategies thus greatly simplifies coil design and reduces the sensitivity of decoupling effects to minor variations in coil construction.

In the presently preferred exemplary embodiment, a QD MRI RF coil for coupling MRI RF signals from a human head volume is constructed within a helmet-like structure adapted to fit over a human head. Within the helmet structure, a pair of zero-pitch solenoidal coils are disposed with substantially mutually perpendicular longitudinal axes. One of the solenoidal coils has its longitudinal axis disposed substantially parallel to an axial line running from the top of the head through its neck (when a head is placed in the helmet). The other of the solenoidal coils in this exemplary embodiment has its longitudinal axis disposed substantially parallel to a lateral line running from one lateral side of the head to its other lateral side (when the head is placed in the helmet). Both of the solenoidal coils are preferably formed as printed circuit conductors on a transparent substrate. The composite printed circuit structure preferably is flexible and is conformed to the helmet structure after printed circuit formation. Free ends of the printed circuit traces are either soldered to one another (to complete zero-pitch turns of a given solenoidal coil) or the ends are soldered to resonating capacitors, decoupling circuits, receiver and impedance matching circuits, etc.

In the preferred exemplary embodiment, the helmet includes a transparent aperture proximate the area near the eyes of a head to be imaged (when a head is placed in the helmet). Since the printed conductors of the solenoids are of zero-pitch and formed on a transparent substrate, this permits the patient to see through the grid work of interstices formed between the intersecting perpendicular conductive traces of the two solenoidal coils. In the preferred exemplary embodiment, one of the coils is of relatively narrower lateral dimension so as to also permit the patient to see beyond the outside edges of the coil structure. In this manner, potential claustrophobic reactions may be reduced. It also may facilitate visual communication with the patient during imaging procedures.

To accommodate the neck of the patient, one of the solenoidal coils has pairs of turns which in part are opposingly directed to skirt around from the front to the backside of the head and thus conductively complete the turn. In effect, a first portion of each turn is the active portion which resides in a first planar volume (e.g., a volume containing the zero-pitch conductive trace and having parallel planar sides) while the remaining portion of that turn is completed with a skirting-conductive trace disposed in a second planar volume at an angle to the first planar volume. By having pairs of opposingly directed, symmetrically placed, skirt traces, the magnetic field effects associated with the skirt traces substantially cancel each other while still accommodating the presence of the patient's neck.

In the exemplary embodiment, the resonating capacitance is distributed among a plurality of capacitors serially connected along the length of each solenoidal coil. In this manner, the required maximum voltage rating for the capacitors can be minimized. In addition, a passive blocking or decoupling circuit is preferably included approximately mid-way along the length of each solenoidal coil so as to effectively reduce the large induced currents that would otherwise flow in the receive coil during RF transmit times (and thus distort the intended RF transmit field). By not locating the decoupling circuit across the variable tuning capacitances (e.g., varicaps) at the end terminals a more stable decoupling function is achieved (as opposed to unpredictable capacitance changes that might be caused by large induced voltages across a varicap of the blocking circuit were to be disposed across the variable tuning capacitance).

The reduced area equivalent return current loop is facilitated in the exemplary embodiment by mounting connected circuit components on printed circuit boards that are physically attached near the dog leg portions of each solenoidal coil (e.g., near the top of the head and near the right ear respectively for the inner and outer zero-pitch solenoidal coils).

At least one decoupling capacitor is also preferably connected between the coils. The exact point of interconnection and/or value of decoupling capacitance is preferably empirically adjusted at the factory so as to substantially cancel any residual RF signals otherwise undesirably coupled between the solenoidal coils.

BRIEF DESCRIPTION OF THE DRAWINGS

These as well as other objects and advantages of this invention will be more completely understood and appreciated by careful study of the following detailed description of a presently preferred exemplary embodiment of this invention, taken in conjunction with the accompanying drawings, of which.

DETAILED DESCRIPTION OF THE INVENTION

As previously explained with respect to FIG. 1, if two pitched-turn solenoidal coils are oriented as depicted in FIG. 1, there is unfortunately a considerable degree of inter-coil coupling. For various reasons, such inter-coil coupling is very undesirable if the coils are to be used for quadrature detection in MRI. Throughout the following discussion, the x,y,z magnetic coordinate system will be used as depicted in FIG. 1. Here, the main nominally static nominally uniform polarizing magnetic field is assumed to be aligned with the z-axis. Accordingly, in accordance with known MRI procedures, the QD receiving coils should couple independently to magnetic fields that are both transverse with respect to each other and transverse with respect to the polarizing field. For convenience, the QD coil coupling axes will be assumed to be along the x and y coordinate axes as depicted in FIG. 1.

Figure 2:
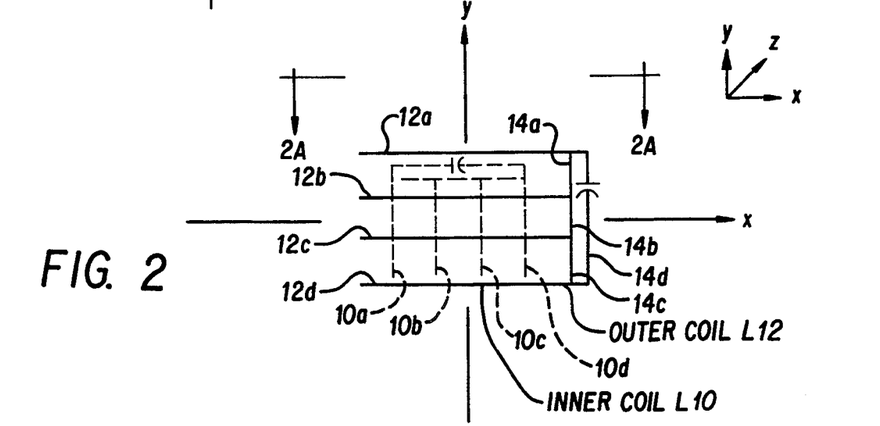
FIG. 2 is a similar schematic depiction of inner and outer MRI RF coils but using zero-pitch solenoidal turns and judiciously placed equivalent return current loops.

In FIG. 2, there is a schematic depiction of modified inner-coil L10 and modified outer coil L12. In particular, these coils use zero-pitch turns. That is, for example, the outer coil L12 as depicted in FIG. 2 includes four zero-pitch turns 12a, 12b, 12c and 12d. These may be thought of as substantially complete circular conductive traces, for example, that are contained in mutually parallel planar volumes (i.e., a "planar" volume containing conductive trace 12a would have top and bottom sides parallel to the x-z plane separated by just the y-axis dimension of conductive trace 12a). That is, the zero-pitch turns 12a, 12b, 12c and 12d each reside in successive parallel planar volumes.

Inside the outer coil L12, is an inner-coil L10 also comprised of four zero-pitch turns 10a, 10b, 10c, 10d. These turns are also contained in successive parallel planar volumes—albeit the planar volumes are now parallel to the y-z plane rather than to the x-z plane.

Figure 2A:
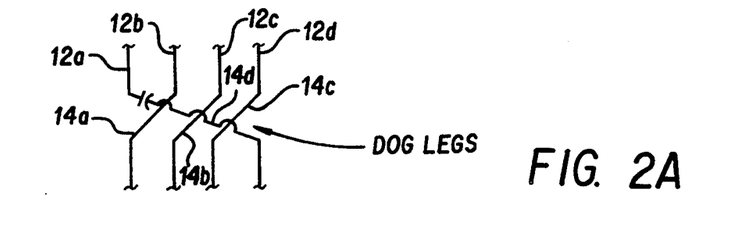
FIG. 2A depicts the dog leg serial interconnections of zero-pitch turns used in FIG. 2.

As may be better seen at FIG. 2A, the zero-pitch turn 12a of outer coil L12 is serially connected with zero-pitch turn 12b by a dog leg interconnecting segment 14A. Similarly, zero-pitch turn 12b is serially connected with zero-pitch turn 12c via a similar dog leg interconnecting trace 14B. Zero-pitch turn 12c is serially connected with zero-pitch turn 12d via dog leg connector 14C. Finally, the remaining ends of the first turn 12a and the last turn 12d are interconnected by a closely juxtaposed another return loop connector (including a resonating capacitance as depicted in FIG. 2A). Similar dog leg serial interconnections and return loop connector are incorporated as part of the inner-coil L10 as also generally depicted in the side view of FIG. 2. Since the equivalent return loops are substantially contained within the x,y plane, it follows that any spurious magnetic coupling associated with such equivalent loops will be primarily oriented parallel to the z-axis (thus avoiding or at least greatly minimizing direct inter-coil coupling via these equivalent return loops).

Figure 3:
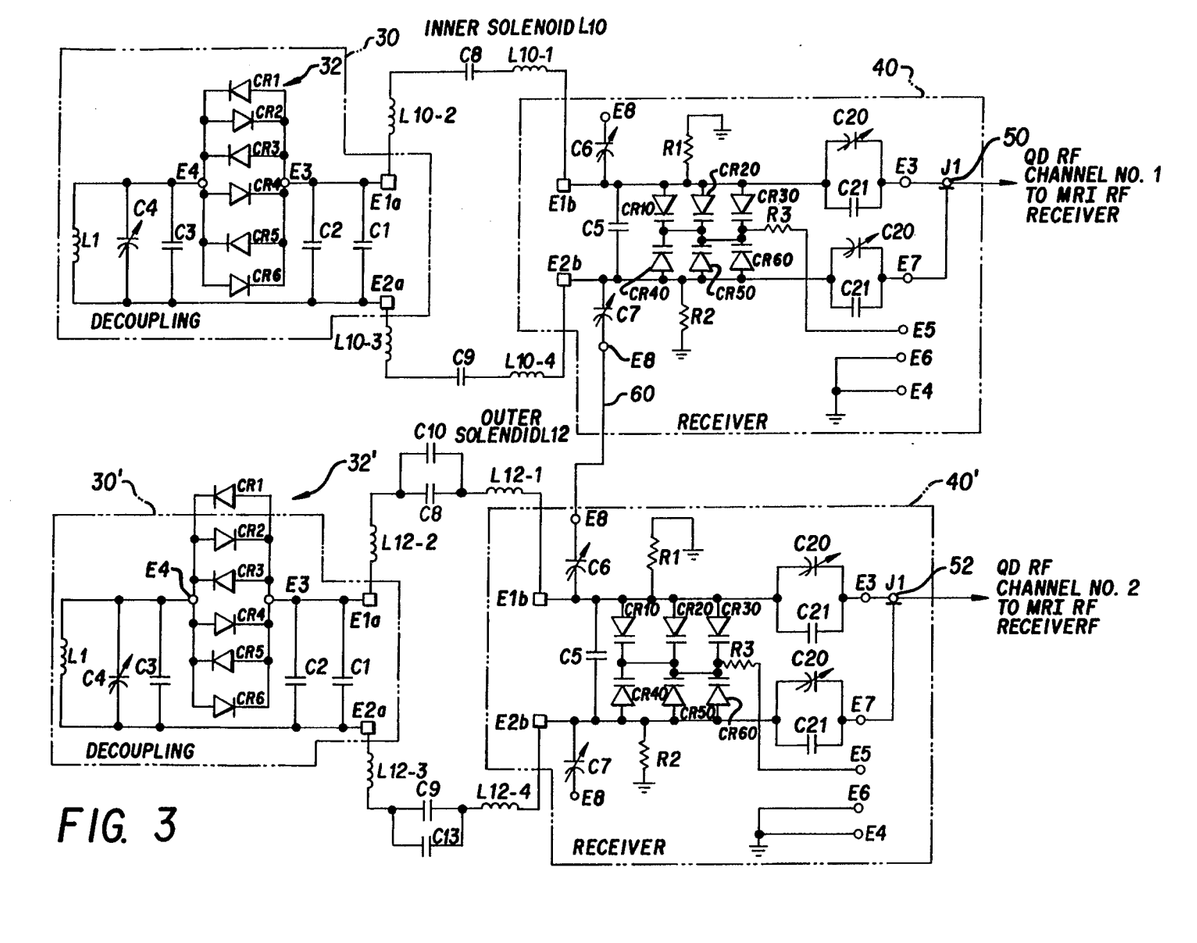
FIG. 3 is an electrical circuit schematic diagram of an exemplary MRI QD RF coil assembly in accordance with this invention using the coils depicted in FIGS. 2 and 2A.

To help minimize the maximum tuning capacitor voltage rating, the tuning capacitance is preferably distributed along the length of each RF coil. For example, as depicted in FIG. 3, the inner solenoidal coil L10 is divided into four portions L10-1, L10-2, L10-3, and L10-4. Resonant tuning capacitors, C8 and C9 are connected serially within the first and last halves, respectively, of the inner solenoidal coil. At approximately the mid-point of the coil, fixed tuning capacitances C1, C2 are connected as part of the decoupling circuit 30 . In the exemplary embodiment, capacitors C1, C2, C8 and C9 may be fixed capacitors having approximately 470 picofarads and a 1200 volts voltage rating (for operation in an MRI system where NMR RF resonance frequencies are near 2.7 megahertz). The remainder of the back-to-back diodes 32 (CR1-CR6) take on a relatively low impedance value when forward biased by relatively strong induced currents during transmission of an MRI RF nutation pulse (typically from a different RF coil structure in this embodiment). Thus, during RF transmit times, diodes 32 effectively switch-connect to additional capacitors C3, C4 and inductor L1 to insert a trap circuit into the solenoidal receiving coil (thus blocking induced currents from distorting the intended RF transmit fields). The passive decoupling circuit 30 is preferably situated approximately mid-way along the solenoidal coil structure so as to use one of the fixed tuning capacitors rather than the varicaps (which may provide unpredictable capacitance if large induced voltages are imposed thereacross. In the exemplary embodiment, C5 may be a 200 picofarad capacitor having a voltage rating of 300 while the variable capacitors may each be 100 picofarad variable capacitors caps having a voltage rating on the order of 150 volts. As will be understood by those in the art, resistors R1, R2 and R3 are employed for the purpose of biasing the variable capacitors. Capacitors C20 and C21 are part of the usual impedance matching circuit. By appropriately adjusting the variable capacitors and capacitors C20, the inner solenoidal coil L10 may be resonated at the appropriate frequency and also matched to the nominal transmission line impedance (e.g., 50 ohm coaxial cable) 50 leading to the QD RF receiver channel number 1 for an NMR system.

An exactly analogous circuit construction and operation is depicted for outer solenoidal coil L12 in FIG. 3. Here, however, additional tuning capacitances C10 and C13 are added in parallel across tuning capacitors C8, and C9, respectively. The result is a second, substantially isolated, QD RF channel number 2 output to the MRI RF receiver (e.g., via coaxial cable 52).

As will be noted, additional variable capacitors C6 and C7 are attached to the terminals E1b and E2b of both the inner and outer solenoids (e.g., as part of the receiver printed circuit boards 40 and 40'). During manufacturing operations at the factory, one of the capacitors C6, C7 on receiver board 40 will be connected to one of the capacitors C6, C7 on receiver board 40' (e.g., as depicted by interconnecting lead 60 in FIG. 3). The interconnected capacitors are adjusted so as to null out or minimize any residual inter-coil coupling between the inner solenoidal coil L10 and the outer solenoidal coil L12. As will be appreciated, one suitable procedure would involve empirically trying each of the four possible combinations of interconnections (and the appropriate nulling capacitance adjustment for each connection) while measuring the minimum inter-coil coupling obtained for each possibility and then selecting the optimum choice for the final configuration as a factory adjustment.

As should now be apparent, the required axial displacement associated with serial interconnection of the turns of each solenoid is effected in a localized manner with dog legs. This together with a closely proximate return current path over the dog leg interconnection area and an appropriate orientation of the equivalent return current loop all helps to minimize undesirable inter-coil coupling between the inner solenoidal coil L10 and the outer solenoidal coil L12.

In the presently preferred exemplary embodiment, the inner solenoidal coil L10 uses for each turn a printed circuit conductive trace approximately 0.020 inch thick and about 0.25 inch wide. In the presently preferred exemplary embodiment, the outer solenoidal coil L12 utilizes printed circuit conductive traces also approximately 0.020 inch thick but approximately 0.50 inch wide. Using a substantially narrower conductive trace for the inside coil appears to provide somewhat improved overall performance (possibly because the copper mass located inside the outer coil does not load the outer coil as much as otherwise would be the case).

Figure 4:
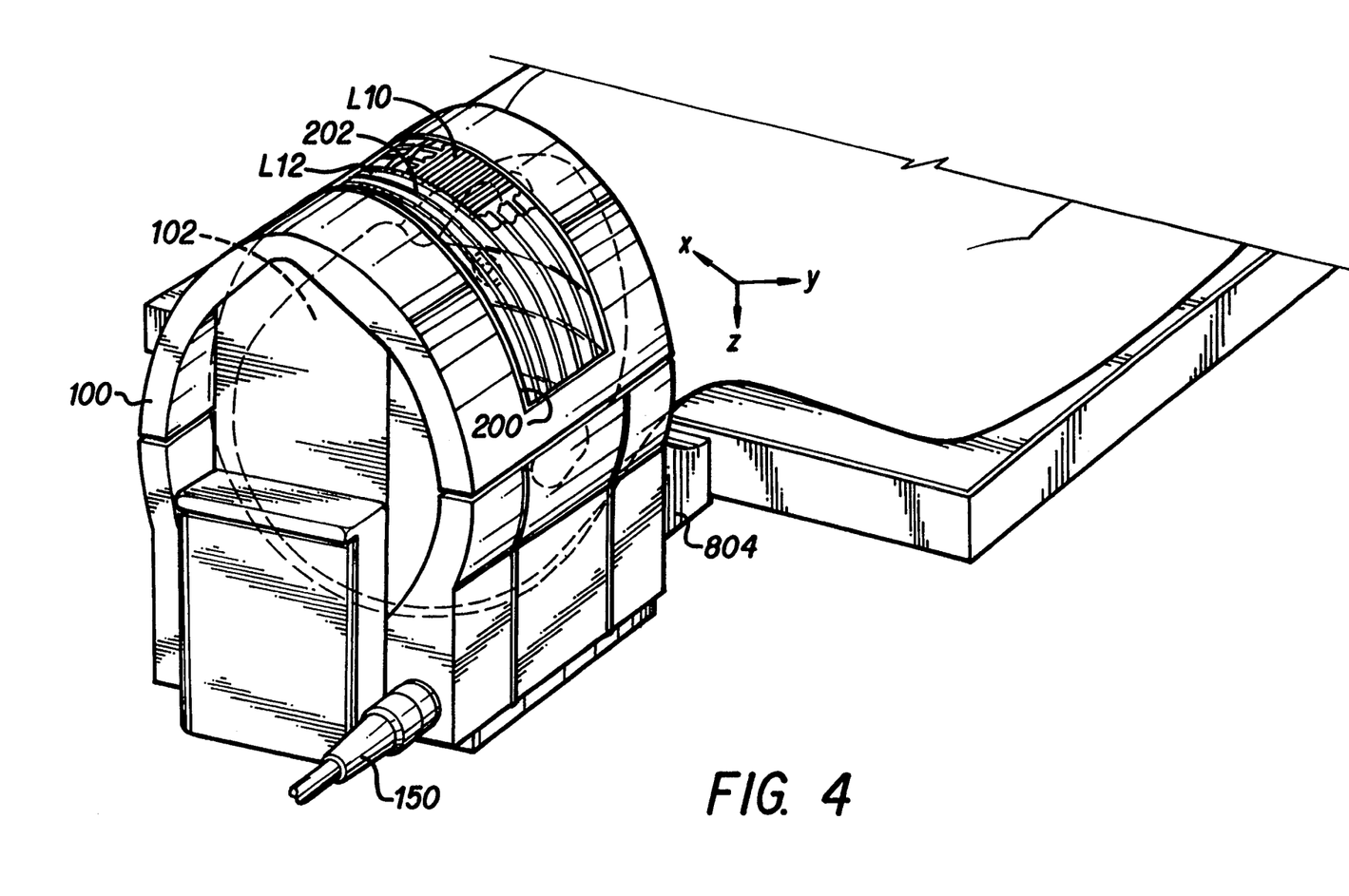
FIG. 4 is a perspective view of a helmet structure incorporating the MRI QD RF coils assembly of FIG. 3.

As depicted in the perspective drawing of FIG. 4, the presently preferred exemplary embodiment incorporates the; zero-pitch solenoidal coils L10 and L12 within a helmet-shaped structure 100. The helmet structure 100 is sized to conveniently permit ingress and egress of a patient head 102 (typically with the patient lying down on a bed surface). The DC bias and RF coaxial cables and the like would, in this exemplary embodiment, be collected together at a common connector 150 to cables passing out of the gantry room and into the MRI control system typically located in an adjacent area.

As also depicted in FIG. 4, the preferred exemplary embodiment helmet structure 100 includes a transparent aperture 200 in an area adjacent the eyes of the patient 102. Furthermore, in the preferred exemplary embodiment, the solenoidal coils L10 and L12 are formed by printed circuit conductive traces on a transparent substrate (e.g., LEXAN). There is a grid work of open interstices 202 formed between the mutually perpendicular conductive traces of coils L10 and L12 through which the patient may look. Furthermore, in the exemplary embodiment, the inner solenoidal coil L10 has a relatively narrow lateral extent so that the patient may actually look beyond the coil L10 (i.e., to either side of the outer edges of the coil) through the aperture 200. As will be appreciated, permitting the patient to have visual contact outside the helmet will tend to minimize claustrophobic reactions. It may also facilitate communication with the patient during MRI procedures.

Figure 6:
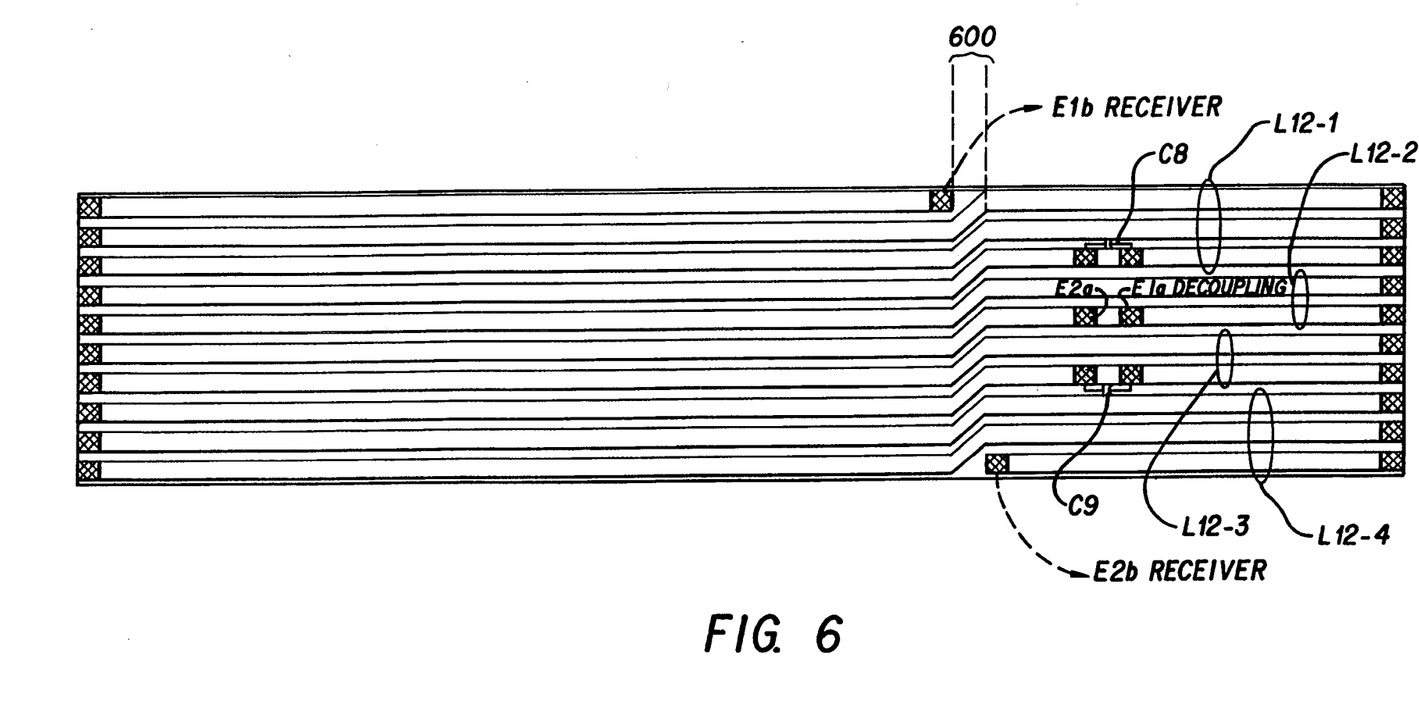

Since the outer solenoidal coil L12 encircles the head with its longitudinal axis running from the top of the head through the patient's neck, it is a relatively simple structure to form with printed circuit traces on a transparent substrate as depicted in flattened-out form at FIG. 6. Here, there are ten zero-pitch turns altogether. It is relatively easy to imagine how the flexible substrate may be formed into a cylinder with matching ends of conductive traces at the ends of the substrate being both physically and electrically interconnected (e.g., by soldering copper strips across pre-tinned juxtaposed portions of these conductive traces. The traces which comprise L12-1, L12-2, L12-3 and L12-4 are also denoted in FIG. 6 to help coordinate these physical structures with the electrical schematic diagrams of FIG. 3. As will be seen, tuning capacitors C8, C9 (as well as the additional parallel capacitances C10 and C13, respectively) may be soldered into place at the appropriate points within the solenoidal coil. The mid-point of the coil at pre-tinned connection points E1a and E2a may be connected to the decoupling circuit 30' (typically a juxtaposed printed circuit board) via suitable conductive strap connectors soldered to the pre-tinned end terminals E1a and E2a as should be appreciated by those in the art.

Finally, the remaining outer end terminals of the solenoidal coil E1b and E2b may be connected to the corresponding receiver printed circuit board via suitable conductive strapping soldered to pre-tinned terminal areas E1b and E2b as should also be appreciated by those in the art. In accordance with this invention, the return loop and associated tuning capacitance C5 should be closely adjacent and proximate the dog leg inter-turn connector gap 600. That is, the return current loop should be made as closely and as directly as possible between terminals E1b and E2b.

Figure 5:
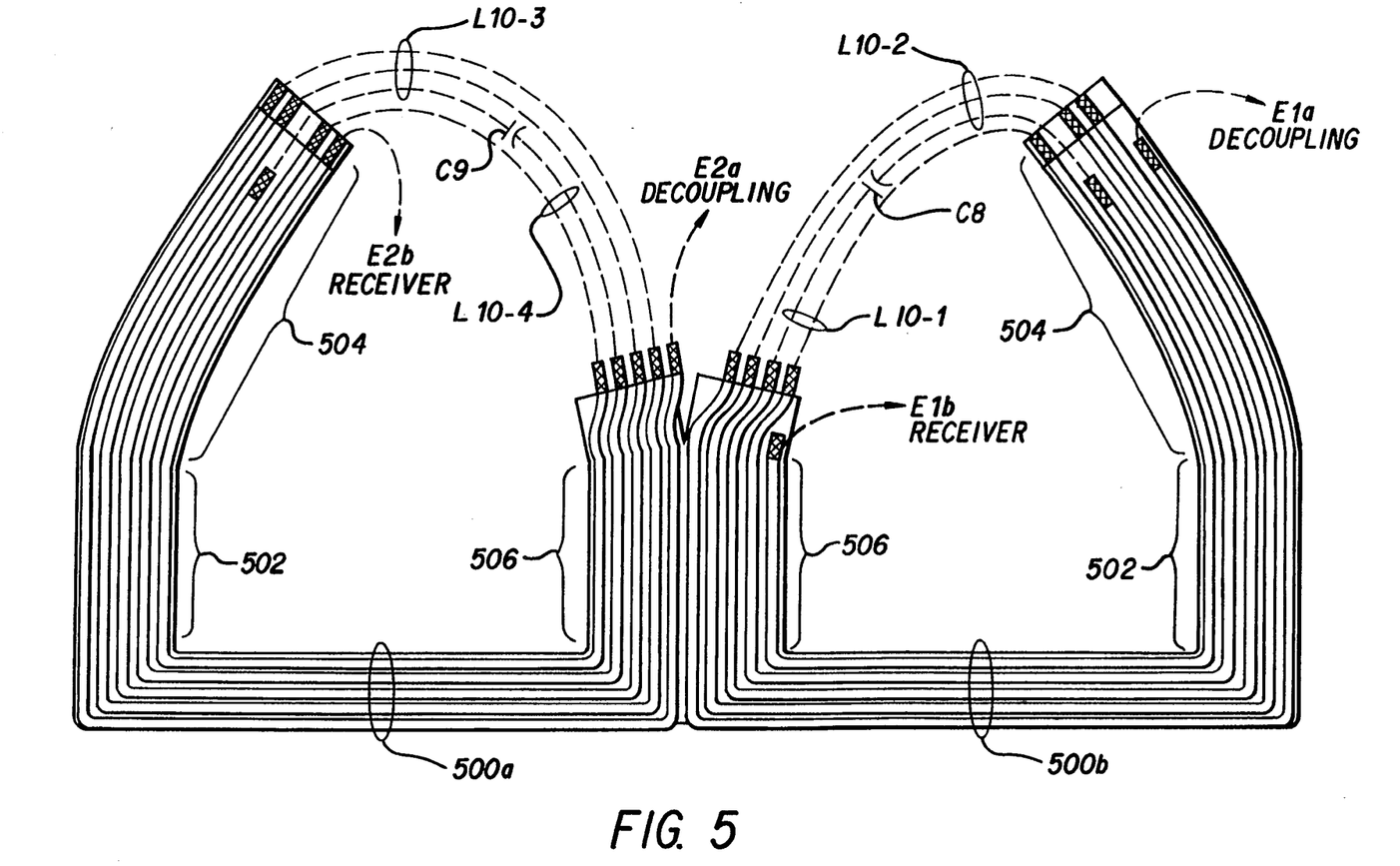
FIGS. 5 and 6 depict the printed circuit conductive traces used to realize the inner and outer zero-pitch solenoidal QD coils in the exemplary embodiment of FIGS. 2–4.

A flattened-out version of the inner solenoidal coil L10 is depicted at FIG. 5. Here, it is somewhat more difficult to visualize how the flattened-out printed circuit traces are conformed and fitted together to form the overall solenoidal coil having an effective longitudinal axis that runs laterally from one side of the head to the other. Of course, as will be appreciated, one difficulty with the straightforward construction of the inner solenoidal coil is the presence of the patient's neck which prevents a direct continuation of the turn conductors through it. To overcome this problem, oppositely directed pairs of symmetrically disposed skirting conductive traces 500a, 500b are employed to complete each turn. As will be better appreciated from subsequent discussion, each turn of the solenoidal coil L10 may be thought of as proceeding upwardly from the patient's chin along area 502, then arcuately over the top of the patient's head via sections 504 which are then interconnected via dog leg traces at the back of the patient's head to continue downwardly along the back of the head structure with segments 506. When fully assembled, segments 502, 504 and 506 of any given turn will lie in a substantially planar volume (as that term is heretofore been defined)—which is spaced apart and parallel to similar planar volumes containing all of the other zero-pitch turns of the solenoidal coil L10.

However, since the turns cannot be completed through the same planar volumes (because they would thus pass through the patient's neck), skirting conductors 500a, 500b (disposed in oppositely directed symmetrical pairs) will complete the electrical connection for each turn of the coil. Even though the skirting traces 500a, 500b individually do produce fields that couple to coil L12, the coupling effects associated with each skirting trace 500a is exactly cancelled by those of its oppositely directed symmetrical skirting trace 500b.

One may visualize placing the center portion of the flexible printed circuit substrate shown in FIG. 5 at the base of a human head (at its back) and wrapping each side forward to meet at the chin area of the patient's head. The segments 504 and 506 are then conformed arcuately down over the top of the patient's head and interconnected as depicted by dotted lines in FIG. 5 so as to complete a three-dimensional structure. When thus conformed to the general geometry of the human head (e.g., as on a transparent coil former to be disposed within helmet structure 100), it may be appreciated that the skirting traces 500a, 500b for any given turn actually extend in a second planar volume substantially perpendicular to the planar volume containing the remainder of that turn (albeit other angular relationships may also be used so long as symmetrically disposed skirting leads are used). Since the skirting traces are symmetrically disposed and directed oppositely (i.e., at any given time oppositely directed equal currents are flowing in symmetrically located oppositely disposed skirt traces 500a, 500b), it follows that the magnetic fields produced by and/or responded to by the skirt traces substantially cancel each other (at least within the imaging volume of interest). In this manner, an effectively solenoidal coil having an longitudinal axis extending laterally from one side of the head to the other and disposed substantially centrally over the human head structure is, nevertheless, structurally and electrically completed while yet permitting passage of the patient's neck and easy head ingress/egress from the helmet structure 100.

Figure 7A:
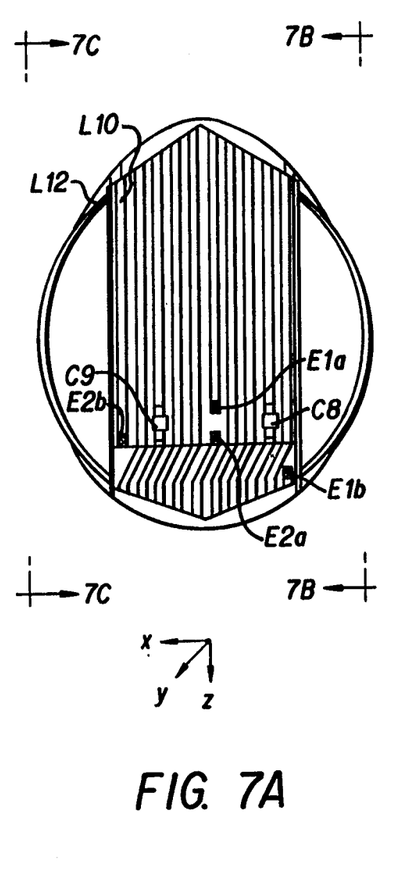
FIGS. 7A, 7B and 7C are top, left-side and right-side views Of a QD coil form assembly employed within the helmet structure of the exemplary embodiment of this invention so as to better visualize the assembled form of printed circuit conductive traces (depicted in a flattened-out form in FIGS. 5 and 6)

FIG. 7A depicts a top view of the coil former inside helmet 100 with solenoidal coils L10 and L12 in place (i.e., by suitably conforming the flattened-out printed circuit traces depicted in FIGS. 5 and 6 and interconnecting them and their associated components. The left side view is shown in FIG. 7C and a right side view is shown in FIG. 7B.

Figure 7B:
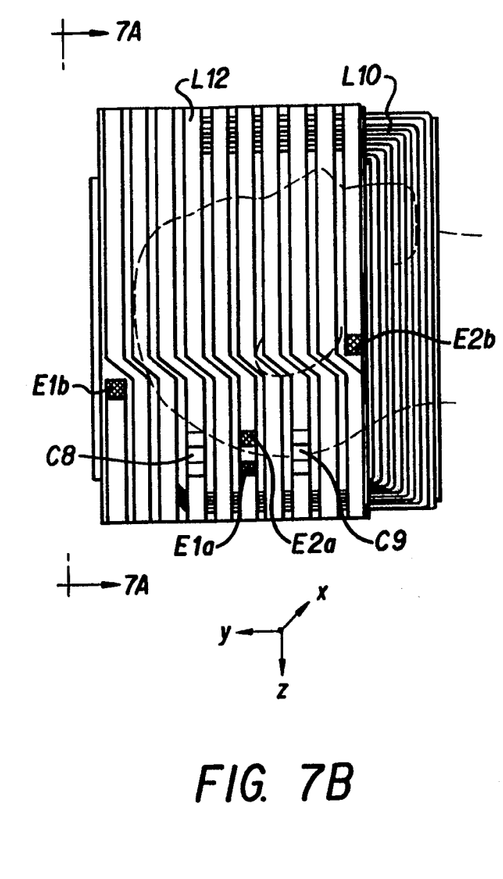
Figure 7C:
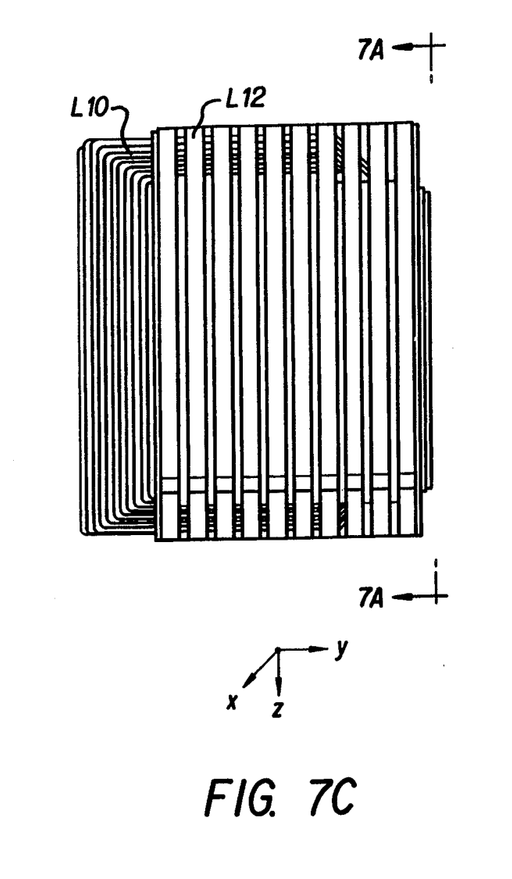

The outer terminals (for connecting to the receiver boards 40 and 40', respectively) of inner-coil L10 and outer coil L12 may be clearly seen in FIGS. 7A and 7B, respectively. The tuning capacitors C8, C9 may also be seen for these coils in FIGS. 7A and 7B. Furthermore, the mid-point terminals E1a and E2a (for connection to decoupling printed circuit boards 30 and 30', respectively) for coils L10 and L12 may also be easily seen at FIG. 7A and 7B. By viewing FIGS. 5, 6 and 7A–7C collectively, in conjunction with the foregoing description, it should be apparent how the flattened-out printed circuit traces on flexible transparent substrate are conformed so as to form the zero-pitch quadrature detection MRI RF coils L10 and L12 for this exemplary embodiment.

It should also be appreciated now that these coils form a grid of transparent interstices at the aperture of the helmet structure through which the patient may see. As will be appreciated from FIGS. 7A and 7B, the equivalent return loop for coil L10 is located near the back of the head while the equivalent return loop for coil L12 is located proximate the patient's right ear. As previously explained, the return current loop is formed as part of the printed circuit receiver boards 40 and for coils L10 and L12, respectively, and should be as closely positioned and connected across the solenoidal coil terminals E1b, E2b as is possible. When in the orientation depicted for the exemplary embodiment, this causes the equivalent return current loops to couple primarily to fields aligned with the z-axis—rather than with either the x-axis or y-axis of the QD receiver coils.

Figure 8A:
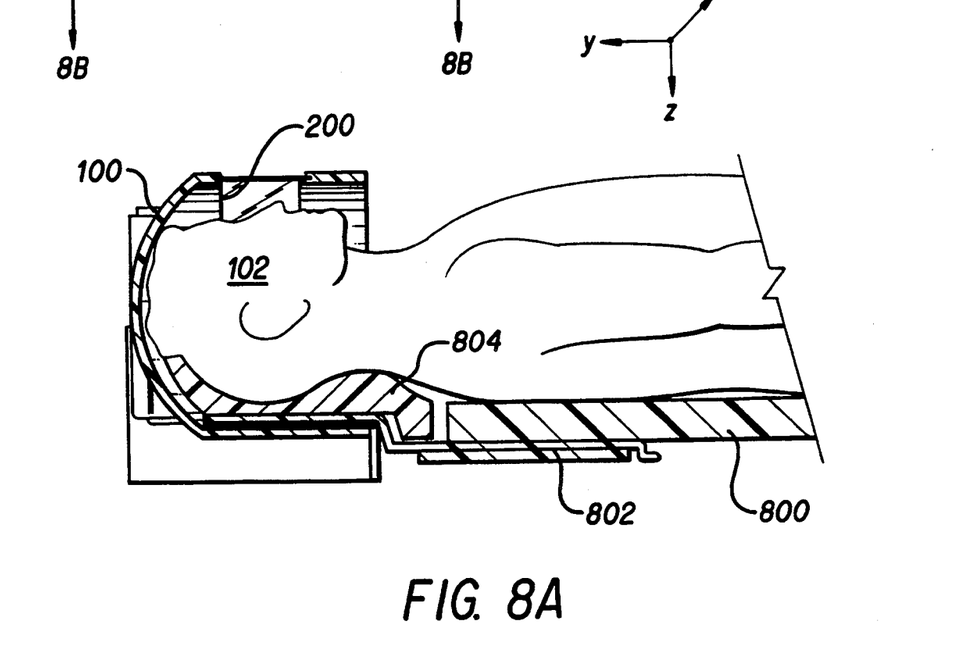
FIGS. 8A and 8B are schematic cross-sectional longitudinal and transaxial views depicting patient anatomy placed within the helmet-like MRI QD coil that is the exemplary embodiment of this invention.
Figure 8B:
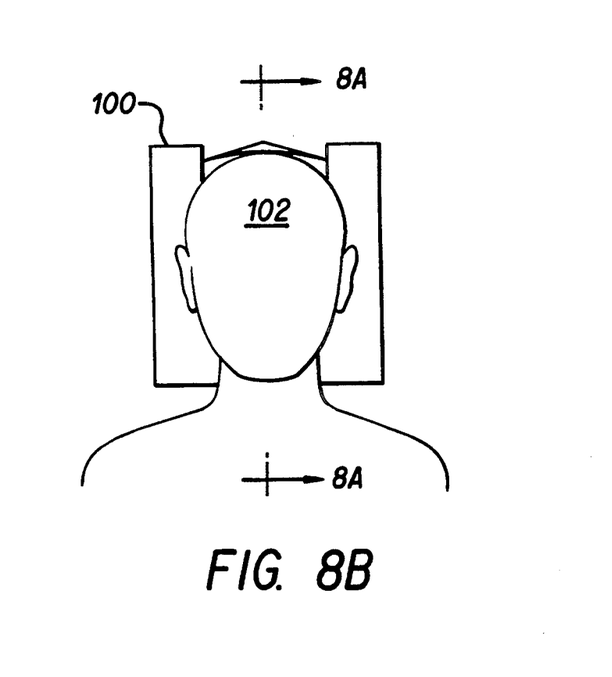

Cross sectional schematic depictions are given in FIGS. 8A and 8B of a human patient 102 having its head anatomy disposed within helmet 100. For example, the patient may be lying horizontally on the usual MRI bed transport system 800. An L-shaped extension support 802 may carry a head/neck support 804 which is designed to conveniently slide into (and possibly support within interlocking mechanical structures) the helmet 100.

By constructing a QD head coil in accordance with this invention, an approximately 20 percent improvement in signal to noise ratio may be observed with respect to existing low frequency head coil structures. As previously noted, such improvements are related, at least in part, to the use of zero-pitch solenoidal turns with dog leg serial interconnections at a localized area over which a return current path may be juxtaposed. In this manner, magnetic fields associated with the equivalent return current loop do not couple to the other solenoidal coil (assuming that the equivalent return current loops are judiciously located).

While only a few exemplary embodiments of this invention have been described in detail, those skilled in the art will appreciate that many variations and modifications may be made in such exemplary embodiments while yet retaining many of their novel features and advantages. Accordingly, all such variations and modifications are intended to be included within the scope of the appended claims.

What is claimed is:

1. A QD MRI RF coil for coupling MRI RF signals from a human head volume to be imaged, said coil comprising:
   a helmet structure adapted to fit over a human head; and
   a pair of zero-pitch solenoidal coils disposed in the helmet structure.

2. A QD MRI RF coil as in claim 1 wherein:
   one of said solenoidal coils has its longitudinal axis disposed substantially parallel to an axial line running from the top of the head through the neck when a head is place in the helmet; and
   the other of said solenoidal coils has its longitudinal axis disposed substantially parallel to a lateral line running front one lateral side of the head to its other lateral side when a head is placed in the helmet.

3. A QD MRI RF coil as in claim 1 wherein said solenoidal coils each comprise printed circuit conductors on a transparent substrate.

4. A QD MRI RF coil as in claim 3 wherein said helmet includes a transparent aperture proximate the area near the eyes of a head when a head is placed in the helmet.

5. A QD MRI RF coil as in claim 1 wherein one of said solenoidal coils includes pairs of opposingly directed conductors in its windings which skirt around outside the base of a head, when a head is placed within the helmet.

6. A QD MRI RF coil as in claim 1 wherein each said solenoidal coil includes a plurality of capacitors distributed serially therealong.

7. A QD MRI RF coil as in claim 1 wherein each said solenoidal coil includes at least one passive circuit to block induced currents therein during an MRI RF transmit period.

8. A QD MRI RF coil as in claim 1 wherein:
   each said solenoidal coil includes zero pitch turns and a return loop passing in close proximity over dog-legged serial interconnections of its zero-pitch turns thereby providing a relatively signal area return loop magnetic field coupling;
   the return loops for both said solenoidal coils being disposed to primarily couple to fields oriented perpendicular to the longitudinal axes of both said solenoidal coils.

9. A QD MRI RF coil as in claim 1 or 8 further comprising at least one decoupling capacitor connected between said solenoidal coils to substantially cancel any RF signals otherwise commonly coupled between said solenoid coils.

10. A MRI RF coil comprising
    a conductive winding having a plurality of conductive turns, of which each conductive turn has at least about 180° of the turn substantially contained within one of a plurality of spaced-apart planar volumes;
    each said conductive turn having a pair of respectively associated ends which are aligned with each other in a respectively associated planar volume across a gap area but which ends are connected serially with the ends of other of said turns within said gap area,
    wherein said serially connected conductive turns comprise conductive traces formed on a planar flexible printed circuit substrate and then conformed to encompass a closed volume with aligned ends of said conductive traces being conductively and physically bonded together, said gap area and the interconnections therewithin being formed by suitably shaped conductive traces on the printed circuit substrate, and
    wherein said printed circuit substrate is transparent at least in an area that will be juxtaposed with a MRI patient's eyes.

11. A MRI RF coil comprising:
    a conductive winding having a plurality of conductive turns, of which each conductive turn has at least about 180° of the turn substantially contained within one of a plurality of spaced-apart planar volumes;
    each said conductive turn having a pair of respectively associated ends which are aligned with each other in a respectively associated planar volume across a gap area but which ends are connected serially with the ends of other of said turns within said gap area,
    wherein at least one of said conductive turns includes a gap with aligned ends that are bridged by at least one capacitor.

12. A MRI RF coil comprising:
    a conductive winding having a plurality of conductive turns, of which each conductive turn has at least about 180° of the turn substantially contained within one of a plurality of spaced-apart planar volumes;
    each said conductive turn having a pair of respectively associated ends which are aligned with each other in a respectively associated planar volume across a gap area but which ends are connected serially with the ends of other of said turns within said gap area and further comprising at least one return conductor and capacitor connected across an end of a first and a last of said turns in said gap area and closely adjacent to [said serial interconnections between the turns which are also in the gap area.

13. A MRI FR coil comprising:
    a conductive winding having a plurality of conductive turns, of which each conductive turn has at least about 180° of the turn substantially contained within one of a plurality of spaced-apart planar volumes;
    each said conductive turn having a pair of respectively associated ends which are aligned with each other in a respectively associated planar volume across a gap area but which ends are connected serially with the ends of other of said turns within said gap area,
    a second conductive winding also having a plurality of conductive turns, of which each conductive turn has at least about 180° of the turn substantially contained within one of a plurality of spaced-apart planar volumes;
    each said conductive turn of the second winding also having a pair of respectively associated ends which are aligned with each other in a respectively associated planar volume across a second gap area but which ends are connected serially with the ends of other of the turns of the second winding within the second gap area;

said first and second conductive windings being coupled to an MRI volume to be imaged but oriented differently thereabout so as to respectively respond to magnetic fields that are transverse to one another, plus providing a composite quadrature detection MRI RF coil.

14. A MRI RF coil as in claim 13 where, in said second conductive winding:

said conductive turns comprise substantially complete rings of conductive strips disposed substantially within spaced-apart parallel planar volumes having a thickness equal to the width of said strips; and said turns are connected serially with the ends of other turns by substantially straight sections of conductive strips disposed at an angle to said parallel planar volumes.

15. A MRI RF coil as in claim 13 wherein, in said second conductive winding:

said serially connected turns comprise conductive traces formed on a planar flexible printed circuit substrate and then conformed to encompass a closed volume with aligned ends of said conductive traces being conductively and physically bonded together, said second gap area and the interconnections therewithin being formed by suitably shaped conductive traces on the printed circuit substrate.

16. A MRI RF coil as in claim 15 where, in said second conductive winding:

said printed circuit substrate is transparent at least in an area that will be juxtaposed with a MRI patient's eyes.

17. A MRI RF coil as in claim 20 which is located within a helmet-shaped structure adapted to fit over a human head and having a view aperture disposed in an area to be juxtaposed with an MRI patient's eyes.

18. A MRI RF coil as in claim 17 wherein the spaced-apart respectively associated conductive turns of the two windings are perpendicular to each other as they pass through the view aperture thus forming a grid of interstitial openings through which the patient may see.

19. A MRI RF coil as in claim 13 where, in said second conductive winding:

at least one of said conductive turns includes a gap with aligned ends that are bridged by at least one capacitor.

20. A MRI RF coil as in claim 13 where, in said second conductive winding:

at least one return conductor and capacitor is connected across an end of a first and a last of said turns in said second gap area and closely adjacent to said serial interconnections between the turns which are also in the second gap area.

21. A MRI RF coil as in claim 20 wherein return loops for the first and second windings are oriented to respond to magnetic fields that are substantially perpendicular to the magnetic fields respectively produced by the turns of said first and second windings.

22. A MRI RF coil as in claim 13 wherein:

each turn of said second conductive winding circumscribes a first- path of approximately 180° in a first planar volume and circumscribes a second path of approximately 180° in a second planar volume;

said first and second planar volumes being angularly oriented with respect to each other; and each pair of said turns having respective skirting paths which extend in symmetric opposite directions with respect to their respective first paths such that magnetic fields produced or sensed by such oppositely extending skirting paths are in opposite directions while magnetic fields produced or sensed by the respective first paths of the pair are in the same direction.

23. A QD MRI RF coil for coupling MRI RF signals to and/or from a human head volume to be imaged, said coil comprising:

a helmet adapted to accept the head portion of a human body;

a first solenoidal coil disposed within said helmet and having a plurality of zero-pitch conductive turns sparred apart along a longitudinal axis and serially interconnected within a predetermined axially-extending region, the longitudinal axis of said first solenoidal coil extending along a line from the top of a human head through its neck region when a head is placed within the helmet; and a second solenoidal coil disposed within said helmet and having plurality of zero-pitch conductive partial turns spaced along a longitudinal axis and serially interconnected within a predetermined axially-extending region, the longitudinal axis of said second solenoidal coil extending along a line passing laterally through one side of a human head to the other when a head is placed within the helmet and substantially perpendicular to the longitudinal axis of the first coil;

symmetrical pairs of said partial turns being completed by opposingly directed skirt conductors extending arcuately around the base of a human head when a head is placed within the helmet.

24. A QD MRI RF coil as in claim 23, wherein said helmet includes a viewing aperture in the vicinity of the eyes of a human head when a human head is placed within the helmet.

25. A QD MRI RF coil as in claim 23 wherein said first and second solenoidal coils comprise printed conductors on a transparent substrate.

26. A QD MRI RF coil as in claim 23 wherein the zero-pitch coils create a grid of transparent interstitial openings.

27. A QD MRI RF coil as in claim 23 wherein:

said first and second coils comprise spaced-apart, printed circuit conductive strips, the strips of said second coil having a width which is substantially less than the width of strips in said first coil.

28. A QD MRI RF coil as in claim 23 wherein said first and second coils each include a plurality of serially disposed capacitors therealong.

29. A QD MRI RF coil as in claim 26 wherein:

a first and a last turn of said first coil are connected by a return conductor passing in close proximity to its axially extending region thereby creating a relatively small area return loop which responds to a magnetic field that is substantially perpendicular to the longitudinal axes of both said first and second coils; and a first and a last turn of said second coil are connected by a return conductor passing in close proximity to its axially extending region thereby creating a relatively small area return loop which responds to a magnetic field that is substantially perpendicular to the longitudinal axes of both said first and second coils.

30. A QD MRI RF coil as in claim 29 wherein the return loops of said first and second coils each include a capacitor.

31. A QD MRI RF coil as in claim 23 wherein the first and second coils each include a passive RF circuit which reduces the induced currents flowing in such coils in the presence of relatively strong MRI RF signals being transmitted into a human head.

32. A QD MRI RF coil as in claim 23 further comprising:

a first RF receiver channel coupling circuit connected across a first and a last turn of said first coil; and a second RF receiver channel coupling circuit connected across a first and a last turn of said second coil.

33. A QD MRI RF coil as in claim 23 further comprising:

at least one decoupling capacitor connected between said first and second coils for increasing the degree of electromagnetic isolation between quadrature channel RF signals respectively coupled to said first and second coils.

* * * * *